United States Patent
Chuang et al.

(10) Patent No.: US 9,196,573 B2
(45) Date of Patent: Nov. 24, 2015

(54) BUMP ON PAD (BOP) BONDING STRUCTURE

(71) Applicant: Taiwan Semiconductor Manufacturing Company, Ltd., Hsin-Chu (TW)

(72) Inventors: Yao-Chun Chuang, Hsin-Chu (TW); Chita Chuang, Kaohsiung (TW); Chen-Cheng Kuo, Chu-Pei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/733,692

(22) Filed: Jan. 3, 2013

(65) Prior Publication Data

US 2014/0035148 A1 Feb. 6, 2014

Related U.S. Application Data

(60) Provisional application No. 61/677,873, filed on Jul. 31, 2012.

(51) Int. Cl.
*H01L 23/48* (2006.01)
*H01L 25/10* (2006.01)
(Continued)

(52) U.S. Cl.
CPC ........ *H01L 23/488* (2013.01); *H01L 23/49838* (2013.01); *H01L 24/13* (2013.01); *H01L 24/16* (2013.01); *H01L 25/105* (2013.01); *H01L 24/81* (2013.01); *H01L 2224/0401* (2013.01); *H01L 2224/05022* (2013.01); *H01L 2224/05124* (2013.01); *H01L 2224/05144* (2013.01); *H01L 2224/05572* (2013.01); *H01L 2224/131* (2013.01); *H01L 2224/13014* (2013.01); *H01L 2224/13082* (2013.01); *H01L 2224/13147* (2013.01); *H01L 2224/141* (2013.01); *H01L 2224/16104* (2013.01); *H01L 2224/16237* (2013.01); *H01L 2224/814* (2013.01); *H01L 2224/81191* (2013.01); *H01L 2224/81385* (2013.01); *H01L 2224/81815* (2013.01); *H01L 2225/1058* (2013.01); *H01L 2924/00014* (2013.01); *H01L 2924/1305* (2013.01); *H01L 2924/13091* (2013.01)

(58) Field of Classification Search
USPC ......... 257/690, 723–725, 778, 762, 750, 738, 257/772, 779–781, E21.505, E23.04
See application file for complete search history.

(56) References Cited

U.S. PATENT DOCUMENTS 5,859,474 A * 1/1999 Dordi ............................ 257/737
6,181,569 B1 1/2001 Chakravorty
(Continued)

FOREIGN PATENT DOCUMENTS

CN 101582406 11/2009
CN 101636831 A 1/2010
(Continued)

*Primary Examiner* — Steven Loke
*Assistant Examiner* — Didarul Mazumder
(74) *Attorney, Agent, or Firm* — Slater & Matsil, L.L.P.

(57) ABSTRACT

The embodiments described above provide enlarged overlapping surface areas of bonding structures between a package and a bonding substrate. By using elongated bonding structures on either the package and/or the bonding substrate and by orienting such bonding structures, the bonding structures are designed to withstand bonding stress caused by thermal cycling to reduce cold joints.

19 Claims, 9 Drawing Sheets

(51) Int. Cl.
    *H01L 23/488* (2006.01)
    *H01L 23/498* (2006.01)
    *H01L 23/00* (2006.01)

(56) References Cited

U.S. PATENT DOCUMENTS

| | | | |
|---|---|---|---|
| 6,268,568 B1 | 7/2001 | Kim | |
| 6,294,840 B1 | 9/2001 | McCormick | |
| 6,339,534 B1 | 1/2002 | Coico et al. | |
| 6,774,474 B1* | 8/2004 | Caletka et al. | 257/686 |
| 6,841,853 B2 | 1/2005 | Yamada | |
| 6,841,875 B2 | 1/2005 | Ohsumi | |
| 6,864,565 B1 | 3/2005 | Hool et al. | |
| 6,913,948 B2* | 7/2005 | Caletka et al. | 438/108 |
| 6,927,498 B2* | 8/2005 | Huang et al. | 257/786 |
| 6,998,532 B2 | 2/2006 | Kawamoto et al. | |
| 7,125,748 B2 | 10/2006 | Grigg et al. | |
| 7,160,805 B1 | 1/2007 | Burke et al. | |
| 7,397,121 B2 | 7/2008 | Chou et al. | |
| 7,408,260 B2 | 8/2008 | Fjelstad et al. | |
| 7,550,837 B2 | 6/2009 | Kimura et al. | |
| 7,638,881 B2 | 12/2009 | Chang et al. | |
| 7,863,742 B2 | 1/2011 | Yu et al. | |
| 7,893,524 B2 | 2/2011 | Sunohara et al. | |
| 7,934,313 B1* | 5/2011 | Lin et al. | 29/841 |
| 8,084,871 B2 | 12/2011 | Rahim et al. | |
| 8,119,927 B2 | 2/2012 | Yoda et al. | |
| 8,227,926 B2 | 7/2012 | Topacio et al. | |
| 8,232,641 B2 | 7/2012 | Ozawa et al. | |
| 8,324,740 B2 | 12/2012 | Hagihara | |
| 8,445,355 B2 | 5/2013 | Abou-Khalil et al. | |
| 8,624,392 B2 | 1/2014 | Yew et al. | |
| 2002/0155637 A1 | 10/2002 | Lee | |
| 2002/0164836 A1 | 11/2002 | Ho | |
| 2003/0151140 A1 | 8/2003 | Nishiyama et al. | |
| 2003/0227025 A1 | 12/2003 | Ochi et al. | |
| 2004/0026782 A1 | 2/2004 | Anzai | |
| 2004/0125577 A1 | 7/2004 | Vinciarelli et al. | |
| 2004/0132230 A1 | 7/2004 | Kim | |
| 2004/0212054 A1* | 10/2004 | Maxwell et al. | 257/678 |
| 2005/0013082 A1 | 1/2005 | Kawamoto et al. | |
| 2005/0142835 A1 | 6/2005 | Ball et al. | |
| 2005/0181545 A1 | 8/2005 | Grigg et al. | |
| 2005/0253231 A1 | 11/2005 | Liu | |
| 2006/0160346 A1 | 7/2006 | Hori | |
| 2007/0069346 A1 | 3/2007 | Lin et al. | |
| 2007/0148951 A1 | 6/2007 | Pang et al. | |
| 2007/0200239 A1 | 8/2007 | Su | |
| 2008/0102620 A1 | 5/2008 | Sakaguchi | |
| 2008/0116588 A1 | 5/2008 | Van Kleef et al. | |
| 2008/0142994 A1 | 6/2008 | Lu et al. | |
| 2008/0182398 A1 | 7/2008 | Carpenter et al. | |
| 2008/0265413 A1 | 10/2008 | Chou et al. | |
| 2008/0298034 A1 | 12/2008 | Park et al. | |
| 2008/0308934 A1 | 12/2008 | Alvarado et al. | |
| 2009/0014869 A1 | 1/2009 | Vrtis et al. | |
| 2009/0096079 A1 | 4/2009 | Park | |
| 2009/0152721 A1 | 6/2009 | Huang et al. | |
| 2009/0283903 A1 | 11/2009 | Park | |
| 2010/0117231 A1 | 5/2010 | Lang et al. | |
| 2010/0237491 A1 | 9/2010 | Park et al. | |
| 2010/0237506 A1 | 9/2010 | Brunnbauer et al. | |
| 2011/0074041 A1 | 3/2011 | Leung et al. | |
| 2011/0101519 A1* | 5/2011 | Hsiao et al. | 257/737 |
| 2011/0101526 A1* | 5/2011 | Hsiao et al. | 257/738 |
| 2011/0198753 A1 | 8/2011 | Holland | |
| 2011/0227216 A1 | 9/2011 | Tseng et al. | |
| 2011/0228464 A1 | 9/2011 | Guzek et al. | |
| 2011/0248398 A1 | 10/2011 | Parvarandeh et al. | |
| 2012/0032337 A1 | 2/2012 | Lu et al. | |
| 2012/0049343 A1 | 3/2012 | Schulze et al. | |
| 2012/0098120 A1* | 4/2012 | Yu et al. | 257/737 |
| 2012/0205813 A1 | 8/2012 | Lin et al. | |
| 2012/0228765 A1 | 9/2012 | Alvarado et al. | |
| 2013/0026622 A1* | 1/2013 | Chuang et al. | 257/737 |
| 2013/0062741 A1* | 3/2013 | Wu et al. | 257/666 |
| 2013/0062755 A1* | 3/2013 | Kuo et al. | 257/737 |
| 2013/0087892 A1 | 4/2013 | Yew et al. | |
| 2013/0093079 A1 | 4/2013 | Tu et al. | |
| 2013/0147030 A1* | 6/2013 | Chang et al. | 257/737 |
| 2013/0221522 A1* | 8/2013 | Chen et al. | 257/738 |
| 2014/0035148 A1 | 2/2014 | Chuang et al. | |
| 2014/0048929 A1 | 2/2014 | Cha et al. | |

FOREIGN PATENT DOCUMENTS

| | | |
|---|---|---|
| JP | 02170548 A | 7/1990 |
| KR | 20100104377 A | 9/2010 |
| TW | 201009963 | 3/2010 |
| WO | 2006008701 | 1/2006 |

* cited by examiner

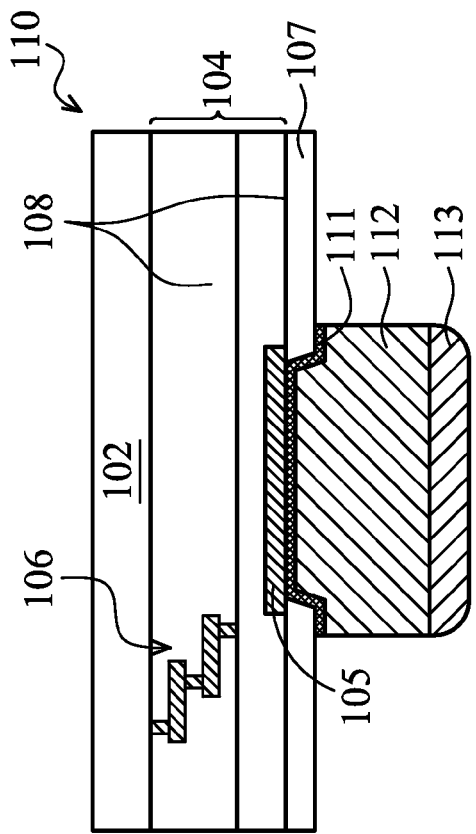
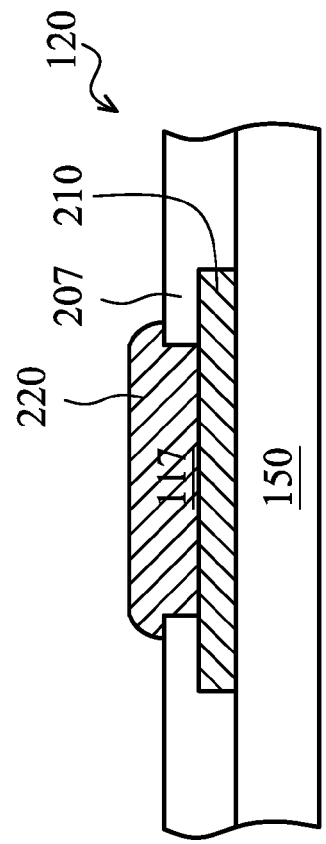
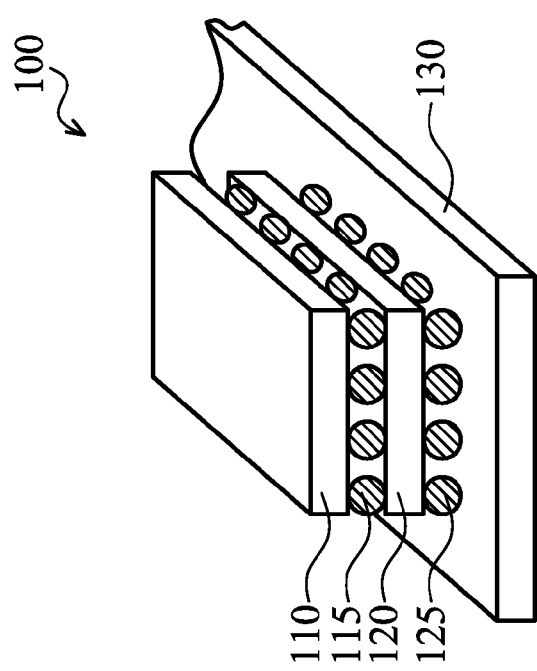

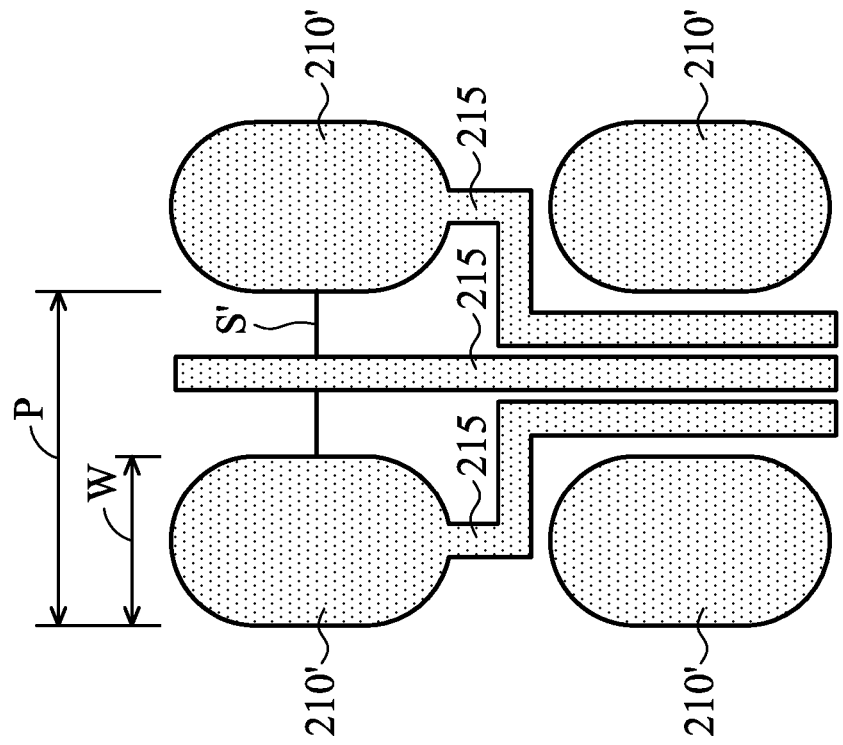
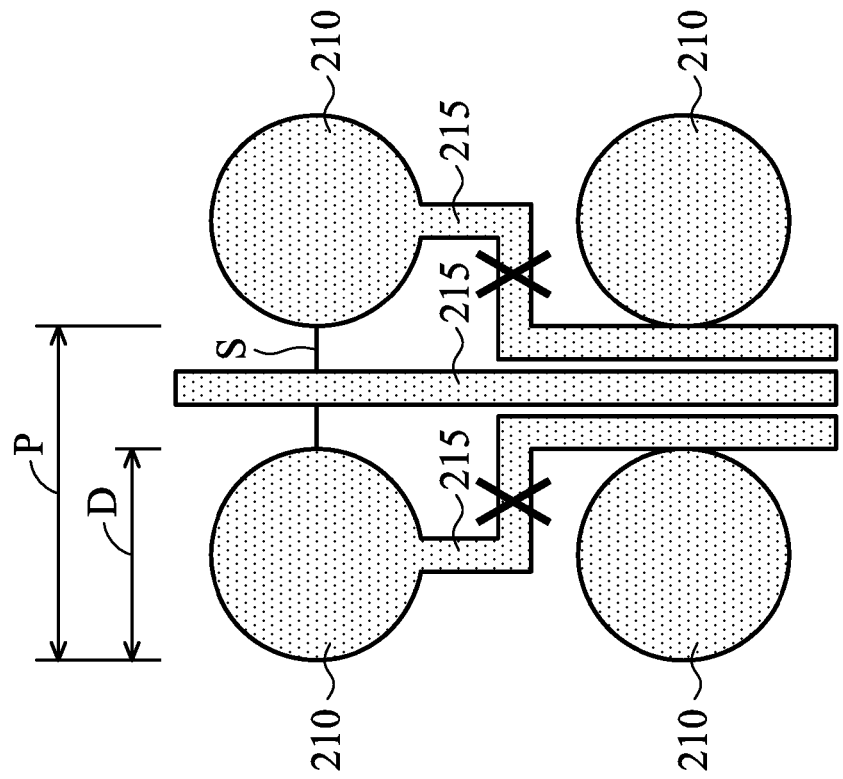

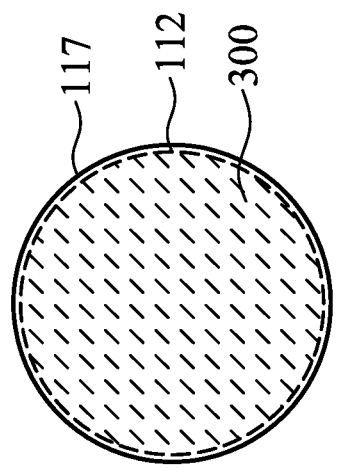
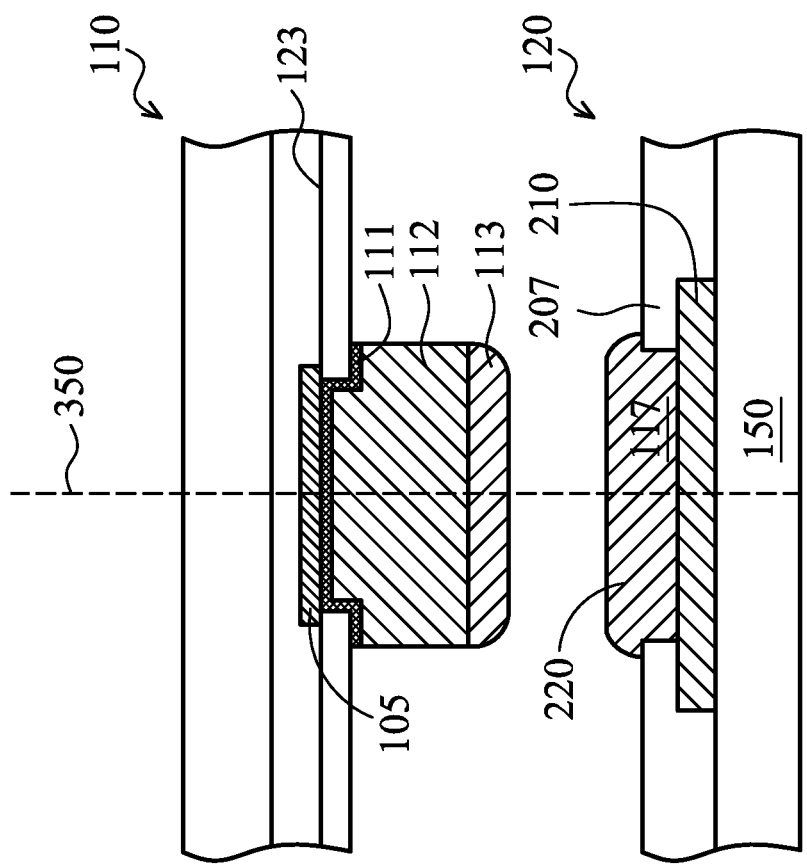
Fig. 3B
Fig. 3A

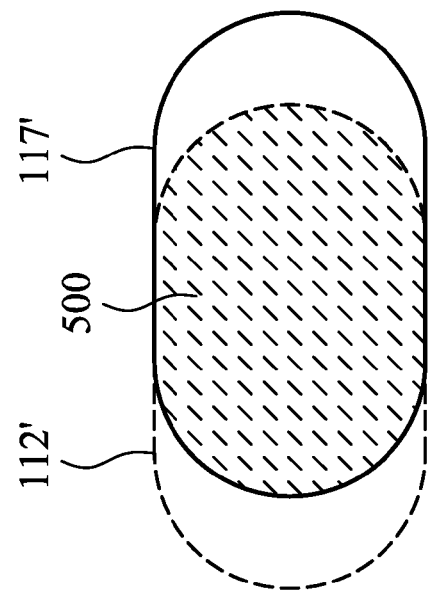
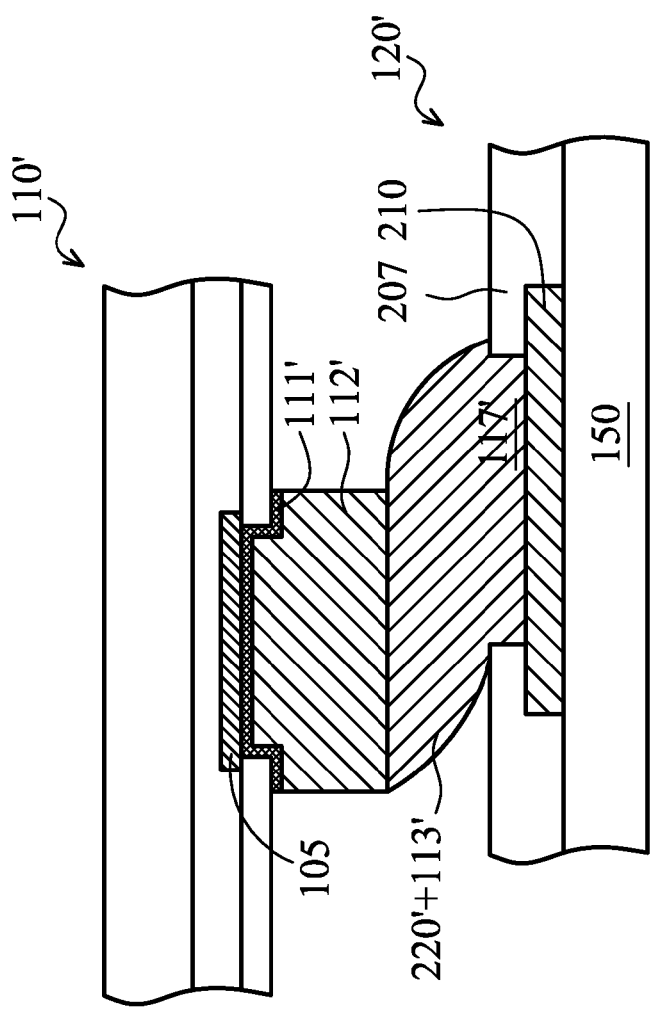
Fig. 5B
Fig. 5A

BUMP ON PAD (BOP) BONDING STRUCTURE

This application claims the benefit of U.S. Patent Provisional Application Ser. No. 61/677,873, filed on Jul. 31, 2012, entitled "Bump on Pad (BOP) Bonding Structure," which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area or smaller heights than conventional packages, in some applications.

Thus, new packaging technologies have begun to be developed. These relatively new types of packaging technologies for semiconductor devices face manufacturing challenges.

BRIEF DESCRIPTION OF THE DRAWINGS

For a more complete understanding of the present disclosure, and some advantages thereof, reference is now made to the following descriptions taken in conjunction with the accompanying drawings, in which:

FIG. 1A is a perspective view of a package structure in accordance with some embodiments;

FIG. 1B illustrates a cross-sectional view of a portion of package and a portion of substrate before they are bonded together, in accordance with some embodiments;

FIG. 1C illustrates a cross-sectional view of a portion of a substrate, in accordance with some embodiments;

FIG. 2A shows a top view of metal pads with interconnecting metal lines, in accordance with some embodiments;

FIG. 2B shows a top view of metal pads with interconnecting metal lines, in accordance with some other embodiments;

FIG. 3A is a cross-sectional view of a package and a substrate prior to bonding, in accordance with some embodiments;

FIG. 3B shows a top view of a copper post and a solder resist opening of FIG. 3A, in accordance with some embodiments;

FIG. 5A is a cross-sectional view of a package and a substrate post bonding, in accordance with some embodiments;

FIG. 5B shows a top view of a copper post and a solder resist opening of FIG. 5A, in accordance with some embodiments;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 3D:
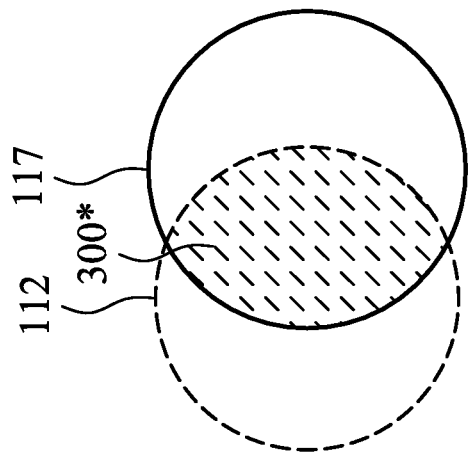
FIG. 3D shows a top view of a copper post and a solder resist opening of FIG. 3C, in accordance with some embodiments.

The making and using of the embodiments of the present disclosure are discussed in detail below. It should be appreciated, however, that the present disclosure provides many applicable inventive concepts that can be embodied in a wide variety of specific contexts. The specific embodiments discussed are illustrative and do not limit the scope of the disclosure.

FIG. 1A is a perspective view of a package structure 100 including a package 110 bonded to a substrate (or bonding substrate) 120, which is further bonded to another substrate 130 in accordance with some embodiments. Package 110 includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Substrate 120 includes a portion of semiconductor wafer, in accordance with some embodiments. Substrate 120 may include silicon, gallium arsenide, silicon-on-insulator ("SOI") or other similar materials. In some embodiments, substrate 120 also includes passive devices such as resistors, capacitors, inductors and the like, or active devices such as transistors. In some embodiments, substrate 120 includes additional integrated circuits. Substrates 120 may further include through substrate vias (TSVs) and may be an interposer. Substrate 120 may be a packaged die, in accordance with some embodiments. In some embodiments, substrate 130 includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Substrate 130 may be made of materials that are used to make substrate 120. In some embodiments, substrate 130 is a multiple-layer circuit board. Package 110 is bonded to substrate 120 via connectors 115, and substrate 120 is bonded to substrate 130 via connectors 125.

FIG. 1B illustrates a cross-sectional view of a portion of package 110 and FIG. 1C illustrates a cross-section view of a portion of substrate 120 near bonding structures before they are bonded together, in accordance with some embodiments. FIG. 1B shows that Package 110 includes a substrate 102 with devices with interconnects formed therein (not shown). As mentioned above, substrate 102 may include a semiconductor substrate such as a silicon substrate, although it may include other semiconductor materials. Interconnect structure 104, which includes metal lines and vias 106 formed therein and connected to the semiconductor devices, is formed on substrate 102. Metal lines and vias 106 may be formed of copper or copper alloys, and may be formed using damascene processes. Interconnect structure 104 may include a commonly known inter-layer dielectric (ILD, not shown) and inter-metal dielectrics (IMDs) 108. IMDs 108 may comprise low-k dielectric materials, and may have dielectric constants (k values) lower than about 3.0. The low-k dielectric materials may also be extreme low-k dielectric materials having k values lower than about 2.5.

Package 110 includes under-bump metallurgy (UBM) layer 111 and a copper post 112 on UBM layer 111. Throughout the description, the copper post 112 is also referred to as a copper-containing bump or metal bump. Although copper post 112 is used as an example in the description here and below, other types of metal bumps, such as solder bumps, may also be used in place of copper post 112. A solder layer 113 is formed over the copper post 112, in accordance with some embodiments. In some embodiments, a solder layer is not formed over the copper post 112. In some embodiments, a metal barrier layer (not shown) is formed between copper post 112 and solder layer 113 to prevent the formation of inter-metallic compound (IMC) formed by mixing of solder and copper. In some embodiments, the barrier layer is made of Ti. The UBM layer 111 is disposed on a metal pad 105, which is connected to the interconnect structure in package 110. Between the interconnect structure 104 and the UBM layer 111 not contacting the metal pad 105, there is a passivation layer 107. In some embodiments, the passivation layer 107 is made of polyimide. In some embodiments, passivation layer 107 includes more than one sub-layer. Metal pad 105 may be connected to input/output structures or other conductive structures on the same metal level through metal lines. In some embodiments, metal pad 105 includes copper and can be pure copper or a copper alloy. In some alternative embodiments, other conductive materials are used instead of copper. For example, metal pad 105 may include aluminum, aluminum alloy, gold, or gold alloy, etc.

In some embodiments, UBM layer 111 includes a diffusion barrier layer and a seed layer. The diffusion barrier layer may be formed of tantalum nitride, although it may also be formed of other materials such as titanium nitride, tantalum, titanium, or the like. The seed layer may be a copper seed layer formed on the diffusion barrier layer. The copper seed layer may be formed of copper or one of copper alloys that include silver, chromium, nickel, tin, gold, and combinations thereof. In some embodiments, the UBM layer 111 includes a diffusion barrier layer formed of Ti and a seed layer formed of Cu.

FIG. 1C shows a substrate 120 including a base substrate 150, in accordance with some embodiments. Substrate 120 includes metal lines and vias (not shown) connecting metal features on opposite sides of substrate 120. The vias of substrate 120 may include plating through holes (PTHs), which are filled with conductive metal(s). Substrate 120 also includes a metal pad 210, which is partially covered by a passivation layer 207. In some embodiments, the passivation layer 207 is a solder resist, which can be patterned by lithography without another photoresist layer. Metal pad 210 may be electrically connected to a ball grid array (BGA) ball (not shown) on the bottom side of substrate 120 through metal lines and vias (not shown). The metal lines and vias are formed in dielectric layers, which may be formed over a semiconductor layer.

Metal pad 210 is formed over a top dielectric layer. Metal pad 210 may be formed of substantially pure copper, aluminum copper, or other metallic materials such as tungsten, nickel, palladium, gold, and/or alloys thereof. Metal pad 210 is partially covered by a passivation layer 207. A solder layer 220 is formed over the metal pad 210 to fill opening formed in the passivation layer 207 for subsequent bonding with the solder layer 113 or copper post 112 (if there is no solder layer 113) of package 110. In some embodiments, the opening formed in the passivation layer 207 is called a solder resist opening (SRO) 117. Metal pad 210 may be connected to input/output structures or other conductive structures on the same metal level through metal lines. In some embodiments, metal pad 210 includes copper and can be pure copper or a copper alloy. In some alternative embodiments, other conductive materials are used instead of copper. For example, metal pad 210 may include aluminum, aluminum alloy, gold, or gold alloy, etc. Details of an exemplary mechanism for forming substrate 120 is described in U.S. patent application Ser. No. 12/852,196, titled "Flip Chip Substrate Package Assembly and Process for Making Same", and filed on Aug. 6, 2010, which is incorporated herein for its entirety.

As mentioned above, metal pads 105 and 210 may be connected to input/output structures or other conductive structures on the same metal level through metal lines. FIG. 2A shows top view of metal pads 210 with interconnecting metal lines 215, in accordance with some embodiments. The metal pads 210 in FIG. 2A are circular and have a pitch P and a space S between metal pads 210. The diameter of metal pad 210 is D. FIG. 2A also shows that three metal lines 215 would not fit into the space S between metal pads 215 without shorting to metal pads 210. FIG. 2B shows top view of metal pads 210' with the same metal lines 215 of FIG. 2A, in accordance with some embodiments. Each metal pad 210' of FIG. 2B has the same surface area as metal pad 210 of FIG. 2A. Metal pads 210 also have a pitch P. Metal pad 210' is elongated and has the shape of a race track. The width of metal pad 210' is W, which is also the diameter of the circular portions of the metal pad 210'. Due to metal pad 210' being elongated, width W of metal pad 210' is smaller than diameter D of metal pad 210. As a result, the space S' between metal pads 210' is larger than S. Three metal lines 215 can fit within the space S' between metal pads 210' without shorting to metal pads 210'. Elongated metal pads provide additional space for routing metal lines. In some embodiments, the pitch P is in a range from about 30 μm to about 200 μm. In some embodiments, the diameter D of the metal pad 210 is in a range from about 20 μm to about 150 μm. In some embodiments, the width W of the metal pad 210 is in a range from about 10 μm to about 100 μm.

In addition to proving extra space for routing metal lines, elongated metal pads also have other benefits. FIG. 3A shows a cross-sectional view of a copper post 112 of package 110 directly over a solder layer 220 of substrate 120 before bonding reflow, in accordance with some embodiments. Copper post 112 is aligned with solder layer 220 with centers of copper post 112 and center of solder layer 220 forming a line substantially perpendicular to a flat surface of substrate 120. FIG. 3B shows top view of copper post 112 and SRO 117 for solder layer 220. In the embodiment shown in FIGS. 3A and 3B, both copper post 112 and SRO 117 are circular and have about the same diameters. The top-view shape of copper post 112 is the same as the UBM layer 111 underneath copper post 112. The top-view shape of copper post 112 is also the same as the solder layer 113 underneath copper post 112. In some embodiments, solder layer 113 is not formed over copper post 112. The relative position of package 110 and substrate 120 are prior to reflow to bond the solder layer 220 with the copper post 112. FIG. 3B shows that copper post 112 completely overlaps SRO 117 with the overlapped surface being the surface area 300 of copper post 112 or SRO 117. Before the bond process, copper post 112 is aligned with solder layer 220, and the centers of copper post 112 and center of solder layer 220 form a line 350 substantially perpendicular to a flat surface 123 of substrate 120.

Due to different coefficients of thermal expansion (CTE) between materials in package 110 and substrate 120, their relative positions can shift after thermal treatment, such as reflow. For example, package 110 include silicon substrate and has an overall CTE about 2-3 ppm/° C., which is lower than the overall CTE of substrate 120, which is about 17 ppm/° C. After thermal treatment, substrate 120 would expand more than package 110 both horizontally and vertically, which causes the shifting of their relative positions. The shifting of their relative positions is more prominent at the edges relative to centers of package 110 and substrate 120.

Figure 3C:
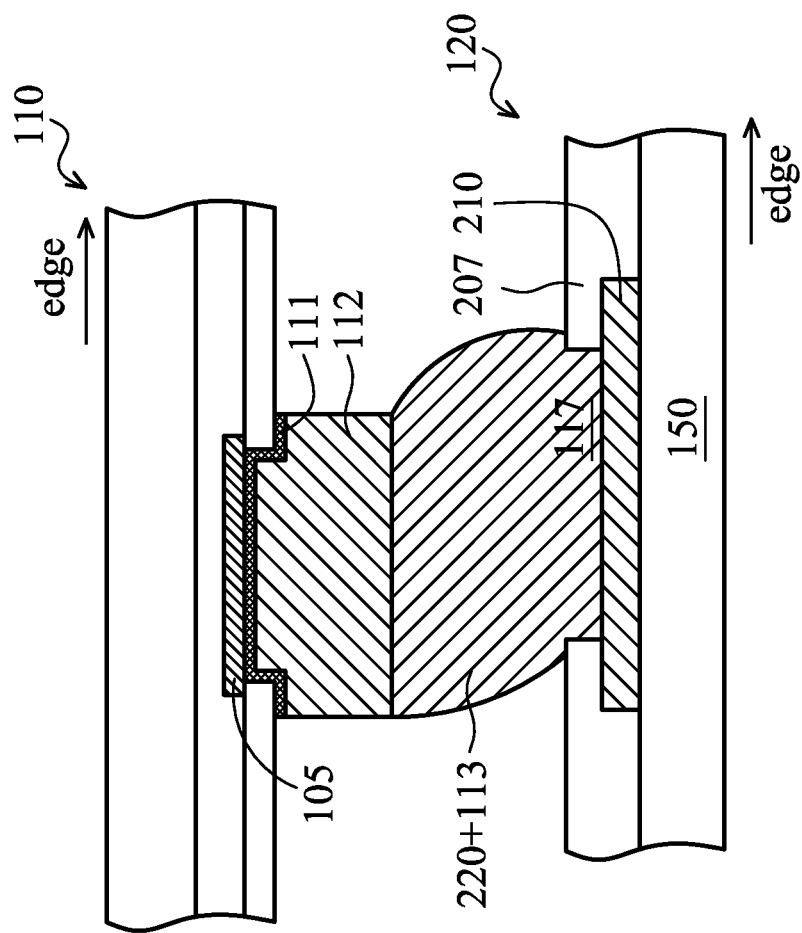
FIG. 3C is a cross-sectional view of a package and a substrate post bonding, in accordance with some embodiments.

FIG. 3C shows a cross-sectional view of structures of package 110 and substrate 120 of FIG. 3A after they are bonded together, in accordance with some embodiments. FIG. 3C shows that substrate 120 shifted more towards the edge than package 110 at the location due to its higher CTE. FIG. 3D shows a top view of copper post 112 and SRO 117 of the bonded structure of FIG. 3C, in accordance with some embodiments. The overlapping surface 300* of copper post 112 and SRO 117 in FIG. 3D is reduced compared to area 300 of FIG. 3B (before reflow).

Figure 4B:
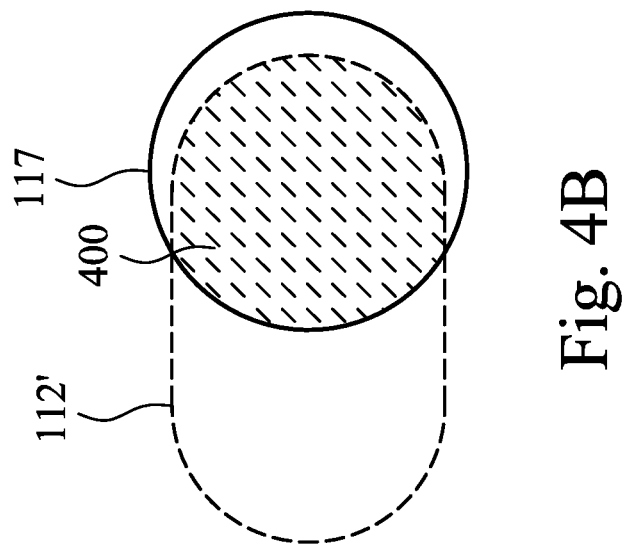
FIG. 4B shows a top view of a copper post and a solder resist opening of FIG. 4A, in accordance with some embodiments.
Figure 4A:
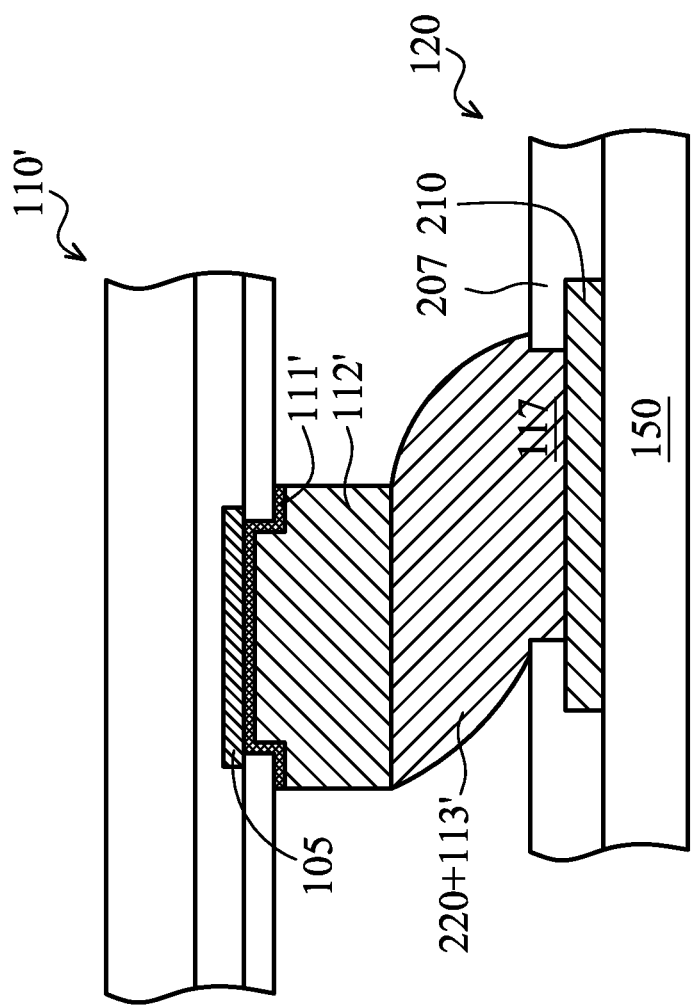
FIG. 4A is a cross-sectional view of a package and a substrate post bonding, in accordance with some embodiments.

FIG. 4A shows a cross-sectional view of a copper post 112' of package 110' over a solder layer 220 of substrate 120 after bonding reflow, in accordance with some embodiments. Copper post 112' is elongated and has a cross-sectional view in race-track shape. Before the bond process, copper post 112' is aligned with solder layer 220, and the centers of copper post 112' and center of solder layer 220 form a line substantially perpendicular to a flat surface of substrate 120. FIG. 4A shows that substrate 120 shifted more towards the edge than package 110' at the location.

FIG. 4B shows top view of copper post 112' and SRO 117 for solder layer 220. The overlapping area of 112' and SRO 117 is 400. Area 400 is less than area 300 of FIG. 3B. However, area 400 is larger than area 300* of FIG. 3D. Larger overlapping surface areas of copper post 112' and SRO 117 make the bonded structure stronger, which reduces stress on the bonded structure and the risk of interfacial delamination and cold joint (or disconnected joint).

FIG. 5A shows a cross-sectional view of a copper post 112' of package 110' over a solder layer 220' of substrate 120' after bonding reflow, in accordance with some embodiments. Both copper post 112' and solder layer 220' have elongated cross-sections with the shape of a race track. Copper post 112' is aligned with solder layer 220' with centers of copper post 112' and center of solder layer 220' forming a line substantially perpendicular to a flat surface of substrate 120 prior to the reflow process (or bonding process). FIG. 5B shows top view of copper post 112' and SRO 117' for solder layer 220'. The overlapping area of 112' and SRO 117' is 500. Area 500 is less than area 300 of FIG. 3B. However, area 500 is larger than area 300* of FIG. 3D. Larger overlapping surface areas of copper post 112' and SRO 117' make the bonded structure stronger, which reduces stress on the bonded structure and the risk of interfacial delamination and also cold joint.

Figure 6:
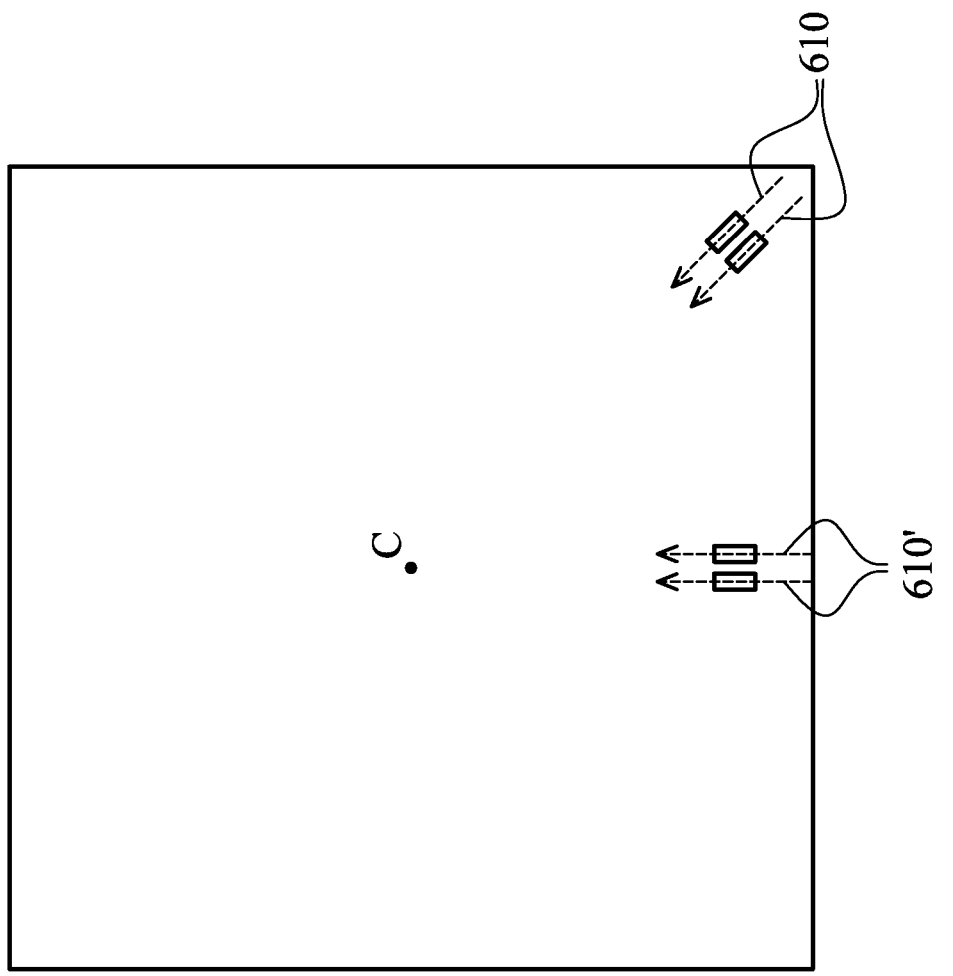
FIG. 6 shows exemplary elongated copper posts on a package, in accordance with some embodiments.

To reduce the stress of bonding structures on packages, the elongated bonding structures are arranged with the axis of an elongated bonding structure to point substantially to the center of a package of substrate. FIG. 6 shows two exemplary elongated copper posts 610 at a package corner and copper post 610' near the center of an edge of the package, in accordance with some embodiments. FIG. 6 shows that elongated copper posts 610 and 610' are arranged to have their axes pointing substantially to the center C of package 110. Similarly, if metal pads (and solder layer on metal pads) are also shaped to be elongated, they should be oriented similarly to copper posts 610 and 610' to maximize the bonding areas. Such arrangement of orientations of elongated copper posts 610 and 610', and consequently the bonding structures, reduces the stress on bonding structures involving the copper posts. As mentioned above, due to the difference in CTEs between package 110 and the bonded substrate 120, package 110 and substrate 120 expand and contract in different degrees during thermal cycling(s). By aligning the axes of the copper posts on package 110 to point towards the center of package 110, the expansion (during heating) and contraction (during cooling) of the posts would follow the directions of expansion or contraction of underlying substrate of package 110.

The various embodiments of shapes and orientations of copper posts and solder layer, which whose profiles are similar to SROs, are described above in FIGS. 3A-6. The shapes and orientations of metal pad 210 underneath solder layer 220 also affect the strength of the bonding structures and the possibilities of interfacial delamination. FIGS. 7A-F show top views various arrangement of copper post 112, SRO 117, and metal pad 210 under SRO 117 before package 110 is bonded to substrate 120, in accordance with some embodiments. These arrangements are merely exemplary. Other arrangements and configurations are also possible.

Figure 7B:
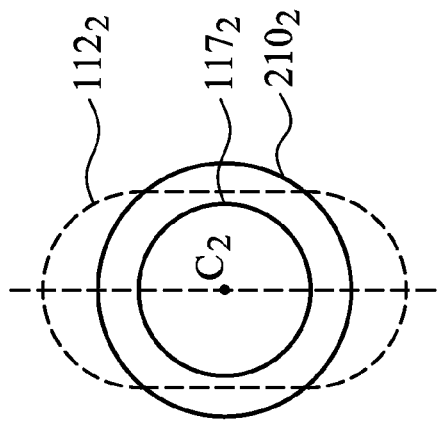
FIGS. 7A-F show top views of various arrangement of a copper post of a package, and a solder resist opening and a metal pad of a substrate prior to bonding, in accordance with some embodiments.
Figure 7D:
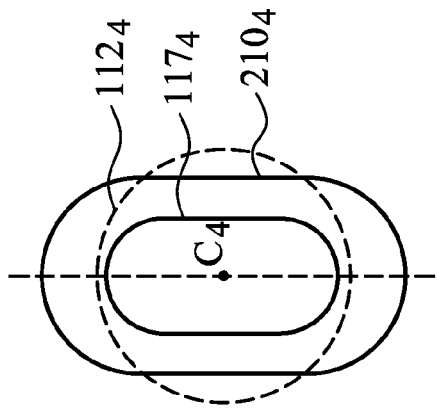
Figure 7A:
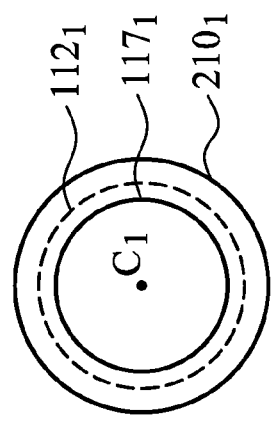

FIG. 7A shows a top view of shapes and alignment of a copper post $112_1$ with an SRO $117_1$ and a metal pad $210_1$ under SRO $117_1$, in accordance with some embodiments. As mentioned above, the shape of solder layer 220 matches fairly closely with the shape of SRO 117. In addition, there could be a solder layer 113 over copper post 112. However, the protected contour of solder layer 113 follows the contour of copper post 112. As shown in FIG. 7A, the diameter of metal pad $210_1$ is larger than the diameter of SRO $117_1$. SRO 117 lands inside the surface of metal pad 210. As mentioned above, the embodiment shown in FIG. 7A could have less overlap of surfaces of copper post $112_1$ and SRO $117_1$ after bonding. The projections of copper post $112_1$, SRO $117_1$ and metal pad $210_1$ under SRO $117_1$ are concentric. In addition, the centers $C_1$ of these three structures are substantially on top of one another.

FIG. 7B shows a top view of shapes and alignment of a copper post $112_2$ with an SRO $117_2$ and a metal pad $210_2$ under SRO $117_2$, in accordance with some embodiments. The copper post $112_2$ is elongated and shaped as a race track. Both SRO $117_3$ and a metal pad $210_3$ under SRO $117_3$ have circular surface areas. The centers and axes of copper post $112_2$, SRO $117_2$ and metal pad $210_2$ under SRO $117_2$ are aligned to be the substantially same or in parallel to make the bonding structures across package 110 and substrate 120 strong and balanced. As mentioned above, the arrangement of FIG. 7B would result in more overlap between copper post $112_2$ and SRO $117_2$ (or solder layer 220). In addition, the centers $C_2$ of these three structures are substantially on top of one another. Such arrangement would allow bonding structures between package 110 and substrate 120 to have lower overall stress than the arrangement shown in FIG. 7A in some embodiments, especially for bonding structures near the edge regions of the bonded package.

Figure 7C:
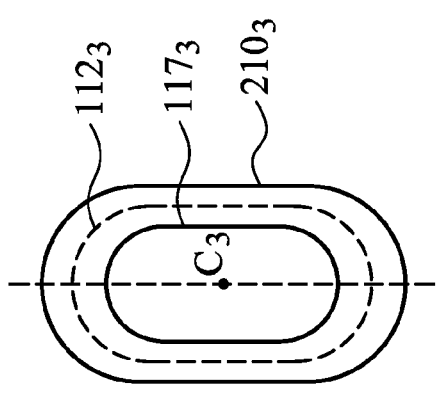

FIG. 7C shows a top view of shapes and alignment of a copper post $112_3$ with an SRO $117_3$ and a metal pad $210_3$ under SRO $117_3$, in accordance with some embodiments. The copper post $112_3$, SRO $117_3$, and metal pad $210_3$ under SRO $117_3$ are elongated and shaped as race tracks in top views. The axes of copper post $112_3$, SRO $117_3$, and metal pad $210_3$ under SRO $117_3$ are aligned and point to the same direction. In addition, the centers $C_3$ of these three structures are substantially on top of one another. Such arrangement would allow bonding structures between package 110 and substrate 120 to have low overall stress than the arrangement shown in FIG. 7A in some embodiments, especially for bonding structures near the edge regions of the bonded package.

FIG. 7D shows a top view of shapes and alignment of a copper post $112_4$ with an SRO $117_4$ and a metal pad $210_4$ under SRO $117_4$, in accordance with some embodiments. FIG. 7D shows that both SRO $117_4$ and metal pad $210_4$ have projections shaped as race tracks. The axes of SRO $117_4$, and metal pad $210_4$ are aligned to distribute stress from bonding and bonding structure evenly. Copper post $112_4$ has a circular projection. In addition, the centers $C_4$ of these three structures are on top of one another. Such arrangement would allow bonding structures between package 110 and substrate 120 to have lower overall stress than the arrangement shown in FIG. 7A in some embodiments, especially for bonding structures near the edge regions of the bonded package.

Figure 7F:
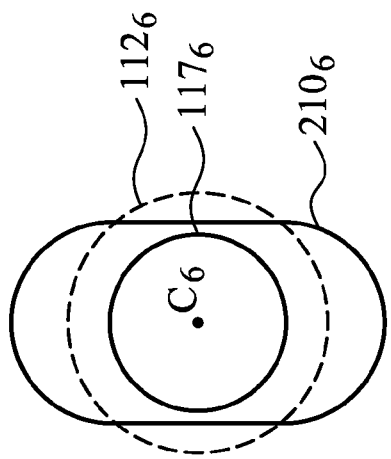
Figure 7E:
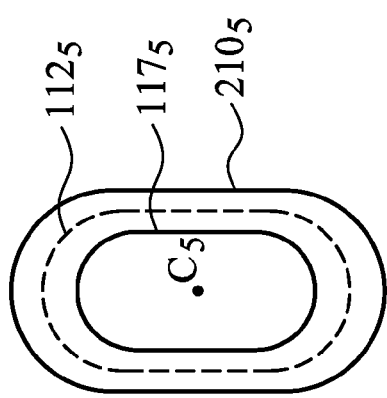

FIG. 7E shows a top view of shapes and alignment of a copper post $112_5$ with an SRO $117_5$ and a metal pad $210_5$, in accordance with some embodiments. FIG. 7E shows that both copper post $112_5$ and metal pad $210_5$ have projections shaped as race tracks. The axes of copper post $112_5$, and metal pad $210_5$ are aligned to distribute stress from bonding and bonding structure evenly. SRO $117_5$ has a circular projection. In addition, the centers $C_5$ of these three structures are substantially on top of one another. Such arrangement would allow bonding structures between package 110 and substrate 120 to have low overall stress than the arrangement shown in FIG. 7A in some embodiments, especially for bonding structures near the edge regions of the bonded package.

FIG. 7F shows a top view of shapes and alignment of a copper post $112_6$ with an SRO $117_6$ and a metal pad $210_6$, in accordance with some embodiments. FIG. 7F shows that both copper post $112_5$ and SRO $117_6$ have projections of circular shapes. Metal pad $210_6$ has a projection of a race track shape. To reduce stress caused by thermal cycling, the axis of metal pad $210_6$ should also substantially point to the center of bonded package. The centers $C_6$ of these three structures are substantially on top of one another.

Figure 8:
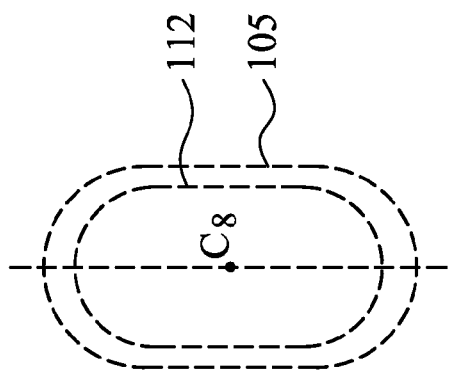
FIG. 8 shows a top view of a copper post and a metal pad of a package, in accordance with some embodiments.

The embodiments described in FIGS. 7A-7F show that copper posts 112 have larger surface areas than SRO 117. However, this is not a requirement. Neither is it necessary. The surface areas of copper posts 112 could be equal to or less than the surface areas of SRO 117. The benefits of lower stress with elongated copper posts 112 and/or SRO 117 as described in FIGS. 4A-5B still apply. When copper post 112 and/or SRO 117 are elongated, the joint surface area between them is increased, such as by 35% in one instance, which results in better joint integrity. The shape, arrangement and relationship of metal pad 105 to copper post 112 are similar to those between SRO 117 and metal pad 210. The surface area of metal pad 105 is equal to or larger than the surface area (or projection) of copper post 112. FIG. 8 shows a top view (or projections) of a copper post 112 and a metal pad 105, in accordance with some embodiments. The center C8 of the copper post 112 and the metal pad 105 substantially overlap. In addition, the axes of the copper post 112 and the metal pad 105 also substantially overlap. Other arrangements and configurations of the copper post 112 and metal pad 105 are also possible.

The embodiments described above provide enlarged overlapping surface areas of bonding structures between a package and a bonding substrate. By using elongated bonding structures on either the package and/or the bonding substrate and by orienting such bonding structures, the bonding structures are designed to withstand bonding stress caused by thermal cycling to reduce cold joint.

In some embodiments, a package structure is provided. The package structure includes a die package with a connecting structure including a copper post, and the copper post has a first cross-sectional area. The package structure also includes a substrate with a solder layer filling an opening over a metal pad. The solder layer makes direct contact with the metal pad, and the opening has a second cross-sectional area. The metal pad has a third surface area, and at least one of the first, second, and third surface area has an elongated shape. The third surface area is wider than the second surface area. The solder layer forms a bonding structure with the connecting structure on the die package.

In some embodiments, a package structure is provided. The package structure includes a package bonded to a substrate through a first bonding structure. The first bonding structure includes a copper post bonded to a first metal pad in the package, and the package includes at least one semiconductor die. The first bonding structure also includes a solder-filled opening formed in a dielectric material, and the solder-filled opening is formed over a second metal pad. A solder layer in the solder-filled opening directly contacts the second metal pad. Axes of projections of the copper post, the first metal pad, the solder-filled opening, and the second metal pad substantially overlap and pointing toward the center of the package. At least one of the projections has an elongated shape.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package structure, comprising:
a die package with a connecting structure including a copper post, wherein the copper post has a first surface area;
a substrate with a solder layer filling an opening over a metal pad, the metal pad having a topmost surface and having a bottommost surface and being a single material from the topmost surface to the bottommost surface, wherein the solder layer makes direct physical contact with the topmost surface of the metal pad and a routing line making direct contact with the bottommost surface of the metal pad, wherein the opening has a second surface area, wherein the metal pad has a third surface area, wherein at least one member from the group consisting of the first, second, and third surface area has a racetrack shape, wherein the third surface area is greater than the second surface area; and wherein the solder layer forms a bonding structure with the connecting structure on the die package.

2. The package structure of claim 1, wherein the opening is surrounded by a patterned solder resist layer.

3. The package structure of claim 1, wherein the axis of the racetrack shape points substantially to a center of the die package.

4. The package structure of claim 1, wherein both the first and the second surface areas have racetrack shapes; wherein axes of the first and the second surface areas substantially overlap and point towards a center of the die package.

5. The package structure of claim 1, wherein the metal pad comprises copper.

6. The package structure of claim 4, wherein the third surface area is also elongated; wherein an axis of the third surface area substantially overlaps with the axes of the first and the second surface area.

7. The package structure of claim 1, further comprising another bonding structure; wherein the pitch of the bonding structure and the another bonding structure is in a range from about 30 μm to about 200 μm.

8. The package structure of claim 1, wherein a width of the racetrack shape is in a range from about 10 μm to about 100 μm.

9. The package structure of claim 1, wherein the substrate has a higher thermal expansion coefficient than the die package.

10. The package structure of claim 1, further comprising another routing line between the metal pad and an adjacent metal pad; wherein the another routing line has an axis parallel to an axis of the racetrack shape.

11. The package structure of claim 1, wherein the metal pad is electrically connected to the copper post in the die package; and wherein there is another routing line between the metal pad and an adjacent metal pad; wherein the another routing line has an axis parallel to an axis of the racetrack shape.

12. A package structure, comprising:
a package bonded to a substrate through a first bonding structure, wherein the first bonding structure comprises:
a copper post bonded to a first metal pad in the package, wherein the package includes at least a semiconductor die;
the substrate including a solder-filled opening formed in a dielectric material, wherein the solder-filled opening is formed over a second metal pad; wherein a solder layer in the solder-filled opening directly contacts the second metal pad, wherein axes of projections of the copper post, the first metal pad, the solder-filled opening, and the second metal pad substantially overlap and the axis of projection of the copper post, the first metal pad, and the solder-filled opening is elongated with a racetrack shape and points toward the center of the package, wherein the second metal pad is a single layer of a homogenous material extending from the solder layer to an interconnect layer in the substrate; and
wherein the copper post has a first surface area, the solder layer has a second surface area, and the first surface area is greater than the second surface area.

13. The package structure of claim 12, wherein the package structure includes a second bonding structure, adjacent to the first bonding structure, and wherein a pitch of first and second bonding structures is in a range from about 30 μm to about 200 μm.

14. The package structure of claim 13, wherein there is at least one routing metal line either on the same level as the first metal pad or the second metal pad, wherein the at least one routing metal line is between the first and second bonding structures.

15. The package structure of claim 12, wherein there is an under-bump metallurgy (UBM) layer between the copper post and the first metal pad.

16. The package structure of claim 12, wherein the solder-filled opening is surrounded by a solder resist layer.

17. The package structure of claim 12, wherein the projections of the copper post, the first metal pad, the solder-filled opening, and the second metal pad all have elongated racetrack shapes.

18. The package structure of claim 17, wherein the second metal pad is formed of a material selected from the group consisting of copper, aluminum, and combinations thereof.

19. The package structure of claim 17, wherein the projections of the copper post and the solder-filled openings are elongated racetrack shapes.

* * * * *

UNITED STATES PATENT AND TRADEMARK OFFICE
CERTIFICATE OF CORRECTION

PATENT NO. : 9,196,573 B2  Page 1 of 1
APPLICATION NO. : 13/733692
DATED : November 24, 2015
INVENTOR(S) : Yao-Chun Chuang et al.

It is certified that error appears in the above-identified patent and that said Letters Patent is hereby corrected as shown below:

In the claims,

In Col. 9, line 41, claim 6, delete "elongated;" and insert --a racetrack;--.

In Col. 9, line 55, claim 10, delete "metal".

Signed and Sealed this
Thirty-first Day of May, 2016

Michelle K. Lee
*Director of the United States Patent and Trademark Office*